US011882713B2

United States Patent
Wu et al.

(10) Patent No.: US 11,882,713 B2
(45) Date of Patent: Jan. 23, 2024

(54) ORGANIC LIGHT-EMITTING DIODE, METHOD FOR MANUFACTURING SAME, AND DISPLAY PANEL

(71) Applicant: BOE Technology Group Co., Ltd., Beijing (CN)

(72) Inventors: Changyen Wu, Beijing (CN); Kuanta Huang, Beijing (CN); Yongqi Shen, Beijing (CN); Minghung Hsu, Beijing (CN); Huaiting Shih, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 256 days.

(21) Appl. No.: 17/359,548

(22) Filed: Jun. 26, 2021

(65) Prior Publication Data

US 2022/0102663 A1 Mar. 31, 2022

(30) Foreign Application Priority Data

Sep. 28, 2020 (CN) .......................... 202011044976.0

(51) Int. Cl.
*H01L 51/50* (2006.01)
*H01L 51/56* (2006.01)
(Continued)

(52) U.S. Cl.
CPC ........... *H10K 50/131* (2023.02); *H10K 50/19* (2023.02); *H10K 59/32* (2023.02); *H10K 71/00* (2023.02);
(Continued)

(58) Field of Classification Search
CPC ................. H10K 50/131; H10K 50/19; H10K 2102/341; H10K 59/32
See application file for complete search history.

(56) References Cited

U.S. PATENT DOCUMENTS

| 2004/0027059 A1* | 2/2004 | Tsutsui | .................. H10K 50/17 313/504 |
| 2014/0246663 A1* | 9/2014 | Kambe | ................ H10K 85/623 257/40 |

(Continued)

FOREIGN PATENT DOCUMENTS

| JP | 2013-207010 A | * | 10/2013 | ............... G02B 5/20 |
| WO | WO2006/085615 A1 | * | 8/2006 | ............. H10K 50/17 |

OTHER PUBLICATIONS

Machine translation, Fukuda, WIPO Pat. Pub. No. WO2006085615A1, translation date: May 2, 2023, Clarivate Analytics, all pages. (Year: 2023).*

(Continued)

*Primary Examiner* — Victoria K. Hall
(74) *Attorney, Agent, or Firm* — IPro, PLLC

(57) ABSTRACT

An organic light-emitting diode (OLED) includes: a first electrode, a first light-emitting layer disposed on a side of the first electrode, a charge generation layer disposed on a side, away from the first electrode, of the first light-emitting layer, a second light-emitting layer disposed on a side, away from the first light-emitting layer, of the charge generation layer, and a second electrode disposed on a side, away from the charge generation layer, of the second light-emitting layer. The OLED further includes: a process conversion layer, disposed between the first electrode and the second electrode, and configured to fill an uneven region between the first electrode and the second electrode.

20 Claims, 9 Drawing Sheets

(51) Int. Cl.
  *H10K 50/13* (2023.01)
  *H10K 71/00* (2023.01)
  *H10K 50/19* (2023.01)
  *H10K 59/32* (2023.01)
  *H10K 59/122* (2023.01)
  *H10K 59/173* (2023.01)
  *H10K 102/00* (2023.01)

(52) U.S. Cl.
  CPC ......... *H10K 59/122* (2023.02); *H10K 59/173* (2023.02); *H10K 2102/341* (2023.02); *H10K 2102/351* (2023.02)

(56) References Cited

U.S. PATENT DOCUMENTS

| | | | |
|---|---|---|---|
| 2016/0190521 A1* | 6/2016 | Lee | H10K 59/32 |
| | | | 257/40 |
| 2017/0025610 A1* | 1/2017 | Kwon | H10K 59/35 |
| 2017/0133631 A1* | 5/2017 | Thompson | H10K 50/131 |

OTHER PUBLICATIONS

Machine translation, Ebihara, Japanese Pat. Pub. No. JP2013207010A, translation date: May 4, 2023, Espacenet, all pages (Year: 2023).*

* cited by examiner

ORGANIC LIGHT-EMITTING DIODE, METHOD FOR MANUFACTURING SAME, AND DISPLAY PANEL

This application claims priority to Chinese Patent Application No. 202011044976.0, filed on Sep. 28, 2020 and entitled "ORGANIC LIGHT-EMITTING DIODE, METHOD FOR MANUFACTURING SAME, DISPLAY PANEL, AND DISPLAY DEVICE", the disclosure of which is herein incorporated by reference in its entirety.

TECHNICAL FIELD

The present disclosure relates to the field of display technologies, and in particular, relates to an organic light-emitting diode (OLED), a method for manufacturing the same, and a display panel.

BACKGROUND

A serial OLED device is an efficient OLED device formed by laminating a plurality of conventional OLED devices in series by connecting layers.

In the related art, a serial device has the problems of current leakage and a cross color, which increases the height of a spacer layer (for example, a pixel defining layer) between sub-pixels, resulting in extension or cut-off of the path of lateral current leakage between light-emitting layers of the sub-pixels.

SUMMARY

The present disclosure provides an OLED, a method for manufacturing the same, and a display panel. The technical solutions are as follows.

In an aspect, an OLED is provided. The OLED includes: a first electrode; a first light-emitting layer, disposed on a side of the first electrode; a charge generation layer, disposed on a side, away from the first electrode, of the first light-emitting layer; a second light-emitting layer, disposed on a side, away from the first light-emitting layer, of the charge generation layer; a second electrode, disposed on a side, away from the charge generation layer, of the second light-emitting layer; and a process conversion layer, disposed between the first electrode and the second electrode, and configured to fill an uneven region between the first electrode and the second electrode.

Optionally, the process conversion layer is disposed between the charge generation layer and the second light-emitting layer.

Optionally, the process conversion layer is disposed between the first light-emitting layer and the charge generation layer.

Optionally, the process conversion layer is disposed between the second light-emitting layer and the second electrode.

Optionally, resistivity of a material of the process conversion layer is greater than $10^3$ ohm×centimeter.

Optionally, the material of the process conversion layer includes insulating oxide.

Optionally, a thickness of the process conversion layer ranges from 0.2 nanometers to 5 nanometers.

Optionally, the second electrode is made of a metal material.

Optionally, resistivity of a material of the process conversion layer is greater than $10^3$ ohm×centimeter; the material of the process conversion layer includes insulating oxide; a thickness of the process conversion layer ranges from 0.2 nanometers to 5 nanometers; and the second electrode is made of a metal material, wherein the process conversion layer is disposed in one of the following manners: between the charge generation layer and the second light-emitting layer, between the first light-emitting layer and the charge generation layer, and between the second light-emitting layer and the second electrode.

In another aspect, a display panel is provided. The display panel includes: a substrate; and a plurality of OLEDs, disposed on the substrate, wherein the OLED includes a first electrode, a first light-emitting layer, a charge generation layer, a second light-emitting layer, a second electrode, and a process conversion layer, wherein the first light-emitting layer is disposed on a side of the first electrode; the charge generation layer is disposed on a side, away from the first electrode, of the first light-emitting layer; the second light-emitting layer is disposed on a side, away from the first light-emitting layer, of the charge generation layer; and the second electrode is disposed on a side, away from the charge generation layer, of the second light-emitting layer, the process conversion layer is disposed between the first electrode and the second electrode, and the process conversion layer is configured to fill an uneven region between the first electrode and the second electrode.

Optionally, a pixel defining layer is provided between the plurality of OLEDs.

Optionally, a pixel density of the display panel is greater than 1000.

In still another aspect, a method for manufacturing an OLED is provided. The method includes: forming a first light-emitting layer on a side of a first electrode; forming a charge generation layer on a side, away from the first electrode, of the first light-emitting layer; forming a second light-emitting layer on a side, away from the first light-emitting layer, of the charge generation layer; and forming a second electrode on a side, away from the charge generation layer, of the second light-emitting layer, wherein a process conversion layer is formed between the first electrode and the second electrode, and the process conversion layer is formed by atomic layer deposition (ALD) or sputtering deposition.

Optionally, the first light-emitting layer, the charge generation layer, the second light-emitting layer, and the second electrode are all film layers formed by an evaporation process; and the process conversion layer is disposed between two film layers formed by the evaporation process.

Optionally, the first light-emitting layer, the charge generation layer and the second light-emitting layer are both organic material layers; and the process conversion layer is disposed between two of the organic material layers.

Optionally, the process conversion layer is disposed between the second light-emitting layer and the second electrode.

Optionally, resistivity of a material of the process conversion layer is greater than $10^3$ ohm×centimeter.

Optionally, the material of the process conversion layer includes insulating oxide.

Optionally, the process conversion layer is formed by depositing aluminum oxide with a thickness ranging from 0.5 nanometers to 1.5 nanometers by ALD.

Optionally, the second electrode is made of a metal material.

BRIEF DESCRIPTION OF THE DRAWINGS

The foregoing and/or additional aspects and advantages of the present disclosure become apparent and easily comprehensible from the description of the embodiments with reference to the accompanying drawings.

REFERENCE NUMERALS

100 OLED; 1 first electrode; 2 first light-emitting layer; 21 red organic light-emitting sublayer; 22 blue organic light-emitting sublayer; 3 charge generation layer; 4 second light-emitting layer; 41 green organic light-emitting sublayer; 5 second electrode; 6 process conversion layer; 7 isolation pillar; 8 first hole injection layer; 9 first hole transport layer; first electron transport layer; 20 second hole injection layer; 30 second hole transport layer; 40 second electron transport layer; 50 electron injection layer; 200 substrate; 01 display panel; and 02 power supply component.

DETAILED DESCRIPTION

The embodiments of the present disclosure are described below in detail. Examples of the embodiments are shown in the accompanying drawings. The same or similar numeral represents the same or similar element or element having the same or similar functions throughout the description. The embodiments described below with reference to the accompanying drawings are exemplary, and are only used to explain the present disclosure but should not be construed as a limitation to the present disclosure.

Figure 1:
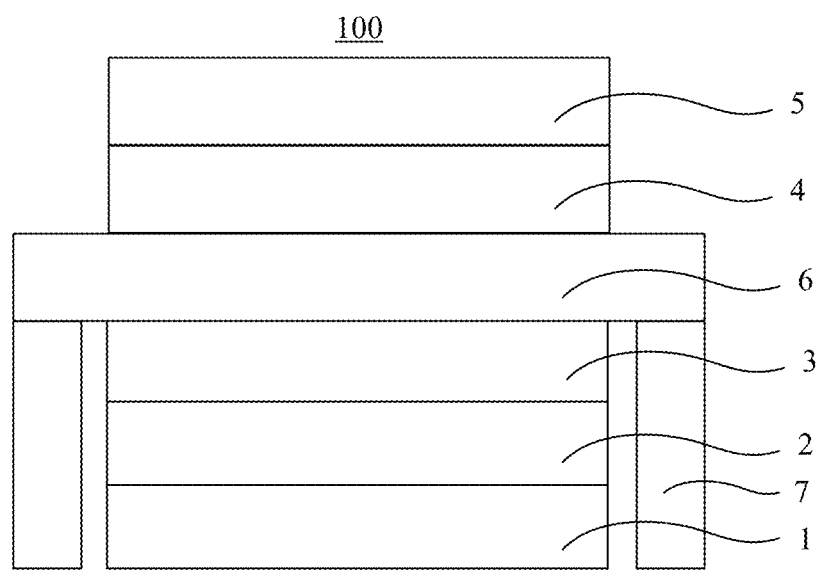
FIG. 1 is a schematic structural diagram of an OLED according to an embodiment of the present disclosure.

In an aspect of the present disclosure, as shown in FIG. 1, an OLED 100 is provided. The OLED 100 includes a first electrode 1, a first light-emitting layer 2, a charge generation layer 3, a second light-emitting layer 4, a second electrode 5, and a process conversion layer 6.

As shown in FIG. 1, in the OLED 100 in the embodiment of the present disclosure, the first light-emitting layer 2 is disposed on a side of the first electrode 1, and the charge generation layer 3 is disposed on a side, away from the first electrode 1, of the first light-emitting layer 2. That is, the first light-emitting layer 2 has two sides, and one side of the first light-emitting layer 2 may be connected to the first electrode 1. The other side of the first light-emitting layer 2 may be connected to the charge generation layer 3. Correspondingly, the second light-emitting layer 4 is disposed on a side, away from the first light-emitting layer 2, of the charge generation layer 3. That is, the charge generation layer 3 also has two sides. One side of the charge generation layer 3 may be connected to the first light-emitting layer 2, and the other side of the charge generation layer 3 may be connected to the second light-emitting layer 4. After one side of the second light-emitting layer 4 is connected to the charge generation layer 3, the second electrode 5 is disposed on a side, away from the charge generation layer 3, of the second light-emitting layer 4.

In addition, the process conversion layer 6 is disposed between the first electrode 1 and the second electrode 5. For example, in FIG. 1, the process conversion layer 6 is disposed between the charge generation layer 3 and the second light-emitting layer 4. The process conversion layer 6 is provided between the first electrode 1 and the second electrode 5, so that short circuit is effectively prevented in the first electrode 1 or the second electrode 5 in the OLED 100, under the premise of ensuring the high luminance and high efficiency of the OLED 100.

Thus, the OLED 100 provided in the embodiment of the present disclosure includes the first electrode 1, the first light-emitting layer 2, the charge generation layer 3, the process conversion layer 6, the second light-emitting layer 4, and the second electrode 5 which are sequentially connected.

In the OLED 100 provided in the embodiment of the present disclosure, the first light-emitting layer 2 and the second light-emitting layer 4 which are disposed between the first electrode 1 and the second electrode 5 are connected in series, to form a serial device. In addition, the OLED 100 provided in the embodiment of the present disclosure includes two light-emitting layers (the first light-emitting layer 2 and the second light-emitting layer 4). Therefore, the two light-emitting layers may simultaneously emit light, so that the overall luminance of the OLED 100 can be improved.

For ease of understanding, the principle of achieving the foregoing beneficial effects by the OLED 100 is first described below in brief.

As described above, as the requirement for the pixel density (pixels per inch, PPI) of a display panel becomes increasingly high, the problem of horizontal cross color among the sub-pixels of different colors becomes increasingly severe in the display panel, especially in a serial device of which the requirement for brightness and service life is relatively high. As the charge generation layer 3 is provided in the OLED 100 of the serial device, the problem of lateral current leakage and cross color among sub-pixels in the display panel becomes increasingly severe.

In the related art, to alleviate the problem of horizontal cross color and current leakage among the sub-pixels of the OLED 100 in a serial device, the height of the spacer layer between the sub-pixels is significantly increased, so as to extend or cut off the path of lateral current leakage between light-emitting layers in the sub-pixels. The spacer layer may be a pixel defining layer (PDL), an isolation pillar 7, a pillar, a rib, or the like. However, by adopting this method, more negative problems hard to be solved may occur in a display panel with a high pixel density. For example, a connection failure of the second electrode 5 may occur. Current leakage may occur in the first electrode 1 and the second electrode 5, and current leakage may occur between the charge generation layer 3 and the first electrode 1 (or the second electrode 5), which results in problems, such as low luminance efficiency, relatively severe color shift, and decrease of light-emitting efficiency of sub-pixels.

Figure 2:
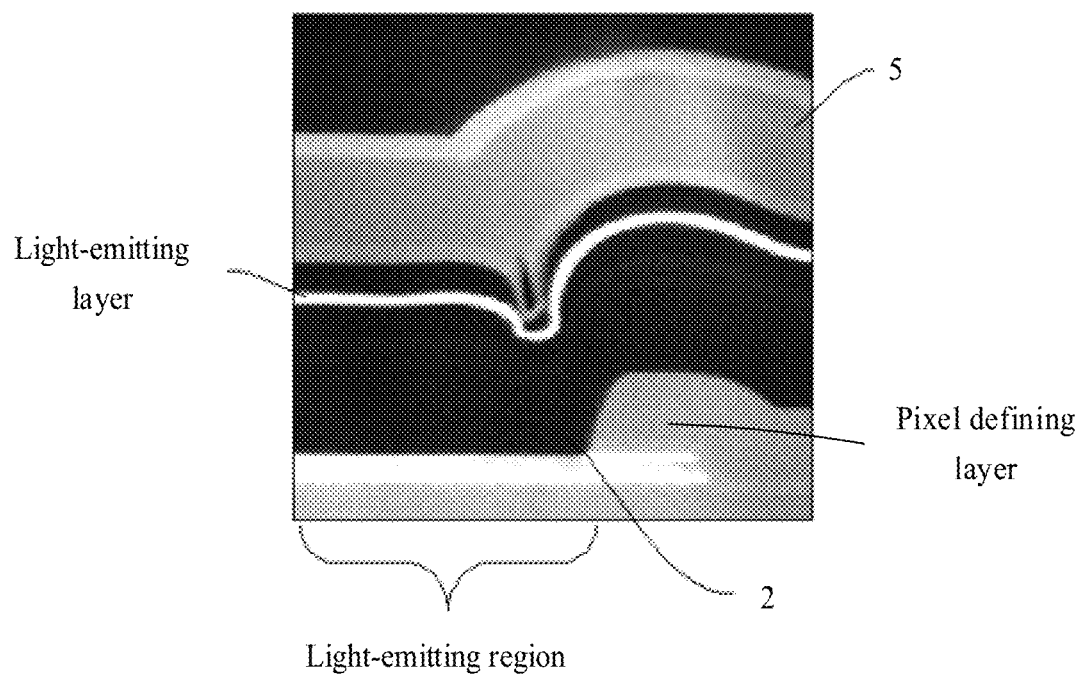
FIG. 2 is an electronic microscope image of an OLED in the prior art.

In addition, the PDL generally leads to unevenness of the light-emitting layer, and reference may be made to FIG. 2 (an SEM image in the prior art). Because the PDL is excessively high, the second electrode 5 deforms, and the second electrode 5 has relatively poor planarization. Because the planarization of the second electrode 5 is relatively poor, the second electrodes 5 in the OLEDs 100 of two adjacent sub-pixels come into contact, resulting in short circuit of the second electrode 5.

For the above, a process conversion layer 6 is provided between two light-emitting layers (the first light-emitting layer 2 and the second light-emitting layer 4) in the serial OLED 100 in the embodiment of the present disclosure, so that the uneven region between two electrodes (the first electrode 1 and the second electrode 5) can be filled, which can avoid the problem of cross color and current leakage among sub-pixels, under the premise of effectively ensuring the high luminance and high efficiency of the OLED 100.

In addition, in the embodiment of the present disclosure, a plurality of light-emitting layers may be provided. That is, the OLED 100 in the embodiment of the present disclosure may include at least two light-emitting layers, for example, the first light-emitting layer 2 and the second light-emitting layer 4. Certainly, in addition to the first light-emitting layer 2 and the second light-emitting layer 4, the OLED 100 may further include more light-emitting layers. In this case, more process conversion layers may be provided, to effectively avoid the problem of cross color and current leakage among the sub-pixels during working of the OLED 100.

In the OLED 100 in the embodiment of the present disclosure, the resistivity of the material of the process conversion layer 6 is greater than $10^3$ ohm×centimeter. Because the resistivity of the process conversion layer 6 is greater than $10^3$ ohm×centimeter, that is, the resistivity of the process conversion layer 6 is relatively large, the electrical conductivity of the process conversion layer 6 may be relatively low. Further, in the case that the process conversion layer 6 is provided to fill the uneven region between two electrodes (the first electrode 1 and the second electrode 5), the process conversion layer 6 does not lead to current leakage between the two electrodes. That is, the process conversion layer 6 with a certain resistivity may be used to short circuit in the first electrode 1, the second electrode 5 or other materials with relatively high electrical conductivity (for example, the charge generation layer 3).

In the embodiment of the present disclosure, the material of the process conversion layer 6 includes insulating oxide. In addition, the thickness of the process conversion layer 6 may be less than 10 nanometers. For example, the thickness of the process conversion layer 6 is less than 5 nanometers. For example, the thickness of the process conversion layer 6 may range from 0.2 nanometers to 5 nanometers.

Therefore, the thickness of the process conversion layer 6 may be relatively small, and the material for manufacturing the process conversion layer 6 includes insulating oxide. Therefore, when the process conversion layer 6 is disposed inside the OLED 100, the impact of the process conversion layer 6 on the electrical conductivity can be ignored. Optionally, the insulating oxide may be aluminum oxide.

Thus, by disposing the process conversion layer 6, the resistance of the serial OLED device can be increased. That is, the resistance value of the overall structure of the OLED 100 can be increased. In the prior art, when the OLED without a process conversion layer works, the resistance value at a current leakage position of the OLED is relatively small, the overall current change amplitude is relatively large. Especially, the current increase amplitude at the current leakage position is relatively large, which easily results in achieving the current leakage voltage before the OLED is lit, leading to current leakage.

In the embodiment of the present disclosure, the process conversion layer 6 is provided between the first electrode 1 and the second electrode 5, and the resistivity of the process conversion layer 6 is relatively high. Therefore, the overall resistance value of the OLED 100 in the embodiment of the present disclosure is relatively large. In this way, when the OLED 100 works, the overall current increase amplitude is relatively gentle, so that the OLED 100 is not conducted to cause current leakage before the ignition voltage of the device reaches, which effectively avoids short circuit in the OLED 100. In addition, the arrangement of the process conversion layer 6 does not affect the performance of the OLED 100.

As shown in FIG. 1, in an embodiment of the present disclosure, the process conversion layer 6 may be disposed between the charge generation layer 3 and the second light-emitting layer 4. The charge generation layer 3 generally contains a conductive constituent, and thus carrier mobility in the layer is relatively high. Carriers easily migrate transversely at the position of the charge generation layer 3. Therefore, when the OLED 100 shown in FIG. 1 is used to form a display panel, it's easy to cause another OLED 100 adjacent to the lit OLED 100 to be lit. Therefore, the current value can be effectively stabilized by disposing the process conversion layer 6 at the position of charge generation layer 3, which effectively avoids the problem of current leakage and cross color among the sub-pixels under the premise of ensuring the high luminance and high efficiency of the OLED 100.

Figure 3:
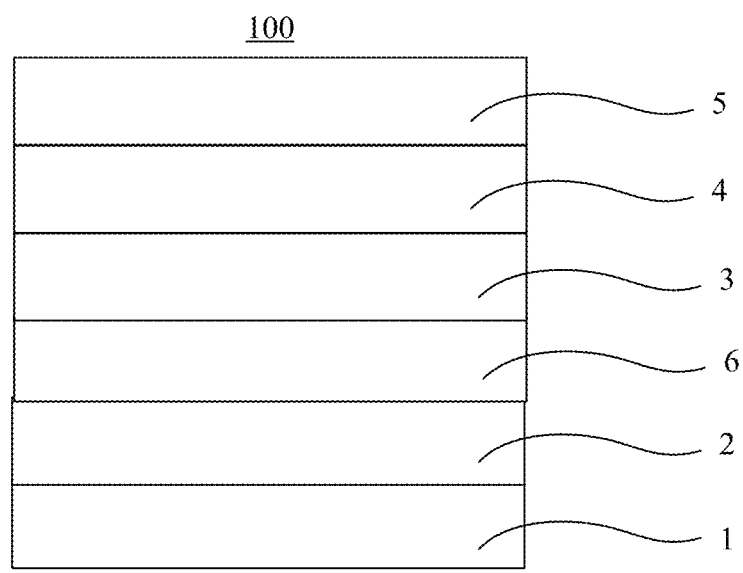
FIG. 3 is a schematic structural diagram of an OLED according to another embodiment of the present disclosure.

As shown in FIG. 3, in another embodiment of the present disclosure, the process conversion layer 6 may further be disposed between the first light-emitting layer 2 and the charge generation layer 3. In addition, the first light-emitting layer 2 and the charge generation layer 3 may both be organic material layers prepared by an evaporation process. That is, the two layers sandwiching the process conversion layer 6 are both organic material layers prepared by the evaporation process. By disposing the process conversion layer 6 between two organic material layers prepared by the evaporation process, the problem of current leakage between the two organic material layers can be effectively avoided.

Figure 4:
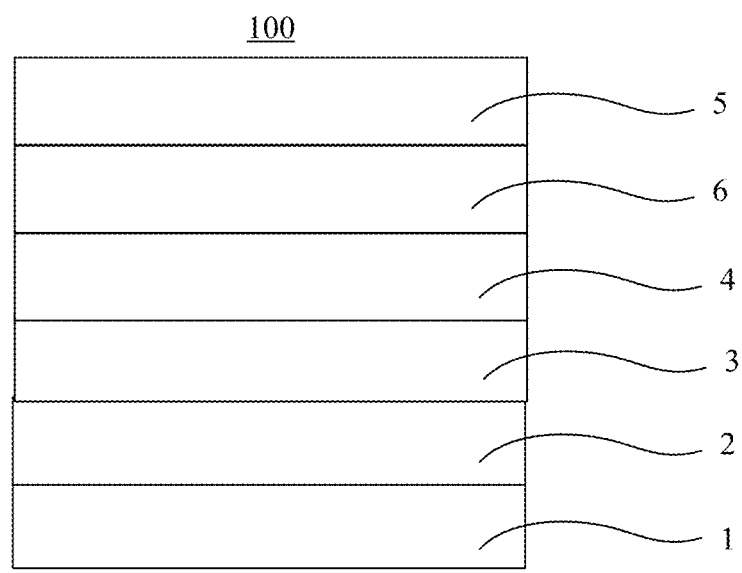
FIG. 4 is a schematic structural diagram of an OLED according to still another embodiment of the present disclosure.

As shown in FIG. 4, in still another embodiment of the present disclosure, the process conversion layer 6 may be disposed between the second light-emitting layer 4 and the second electrode 5. As described above, short circuit easily occurs in the second electrode 5 at the protrusion caused by the PDL. Therefore, when the process conversion layer 6 is disposed between the second light-emitting layer 4 and the second electrode 5, current values at various points can be effectively stabilized, which effectively avoids the problem of current leakage and cross color among the sub-pixels under the premise of ensuring the high luminance and high efficiency of the OLED 100.

In the embodiment of the present disclosure, the process conversion layer 6 is disposed between two organic material layers.

Figure 5:
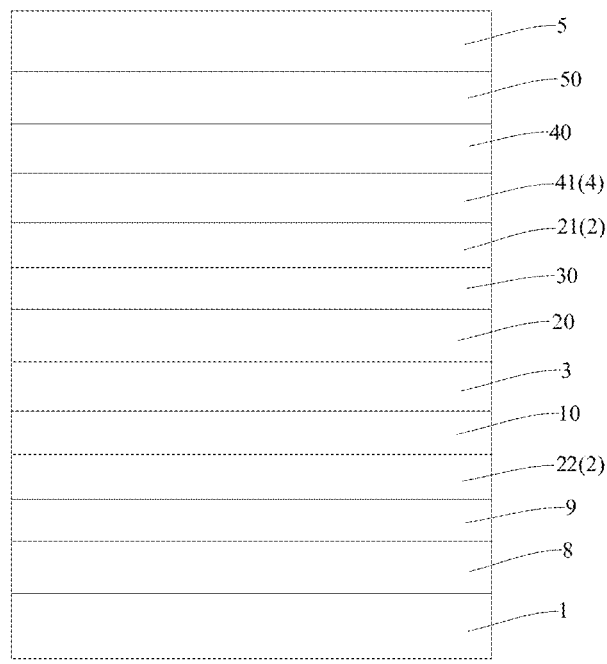
FIG. 5 is a schematic structural diagram of an organic material layer provided in an embodiment of the present disclosure.

Optionally, referring to FIG. 5, in the serial OLED 100, the second electrode 5 may be a cathode, and the first electrode 1 may be an anode. The anode may be formed by ITO. An electron injection layer 50, a second electron transport layer 40, the second light-emitting layer 4 (which may be, for example, a green organic light-emitting sublayer 41), the first light-emitting layer 2 (which may be, for example, a red organic light-emitting sublayer 21), a second hole transport layer 30, a second hole injection layer 20, the charge generation layer 3, a first electron transport layer 10, the first light-emitting layer 2 (which may be, for example, a blue organic light-emitting sublayer 22), a first hole transport layer 9, and a first hole injection layer 8 are provided in sequence between the second electrode 5 and the first electrode 1.

Here, the organic material layers are prepared by an evaporation process, and may include, for example, the first electron transport layer 10, the first light-emitting layer 2 (which may be, for example, a green organic light-emitting sublayer 41), the second light-emitting layer 4 (which may include, for example, a red organic light-emitting sublayer 21 and a blue organic light-emitting sublayer 22), the first hole transport layer 9, the first hole injection layer 8, the charge generation layer 3, the second electron transport layer 40, the second hole transport layer 30, and the second hole injection layer 20. The process conversion layer 6 is provided between two organic material layers. To improve the morphologies, for example, to fill uneven regions, and to fix defects, pin holes, and undercuts in the evaporation process, different process conversion layers 6 may be disposed for implementation, and different process deposition principles may be adopted for implementation, to avoid the problems of current leakage, cross color or color missing of a subpixel color loss during work of the device.

The second electrode 5 is made of a metal material, so that the usage effect of the OLED 100 can be ensured.

In summary, the present disclosure provides an OLED. The OLED includes one process conversion layer disposed between the first electrode and the second electrode, so that the problems of current leakage and cross color between the first light-emitting layer and the second light-emitting layer connected in series in the OLED can be avoided, which ensures a stable current during working of the OLED.

Figure 6:
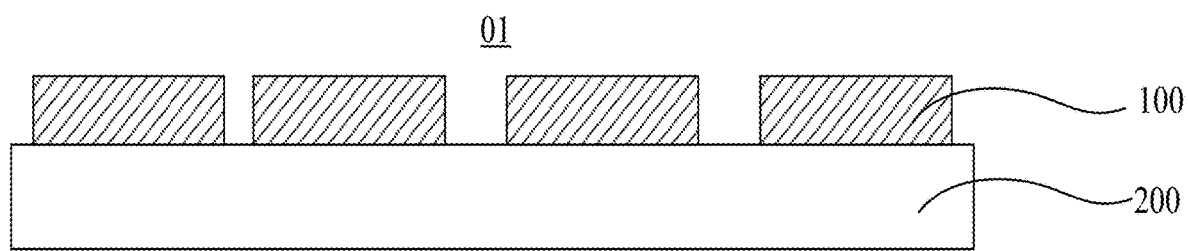
FIG. 6 is a schematic structural diagram of a display panel according to the present disclosure.

FIG. 6 is a schematic structural diagram of a display panel according to the present disclosure. Referring to FIG. 6, the display panel 01 includes a substrate 200 and a plurality of OLEDs 100 disposed on the substrate 200. For example, FIG. 6 shows four OLEDs 100. The OLED 100 is the OLED in the foregoing embodiment. The substrate 200 may provide stable support for the plurality of OLEDs 100.

By disposing the plurality of OLEDs, the high luminance and high efficiency during working of the display panel can be ensured, and the stability of the display panel 01 during working can be effectively ensured, to avoid the problems of current leakage and cross color during working of the display panel 01.

Further, a PDL is disposed between the plurality of OLEDs 100, such that the plurality of OLEDs 100 can be isolated, which effectively ensures the stability of the display panel during working.

In addition, as the process conversion layer 6 is provided, during the arrangement of the PDL, the height of the PDL may be set based on actual demands, without considering whether the PDL is excessively high to cause poor planarization of the organic material layer, resulting in short circuit of the second electrode 5.

Furthermore, the pixel density of the display panel may be greater than 1000 PPI. In addition, the greater the PPI of the display panel is, that is, the higher the pixel resolution of the display panel is, the finer the overall picture of the display panel is. Thus, the overall picture of the display panel is better, the granularity is lower, and a more realistic image is presented. As the process conversion layer 6 is provided, the intervals between the plurality of OLEDs can be reduced, which facilitates a high-PPI display.

In summary, the embodiment of the present disclosure provides a display panel. The display panel is provided with the OLED in the foregoing embodiment. Therefore, when a plurality of OLEDs are connected in series, the display effect of the display panel is not affected. In addition, a PDL is disposed, so that the problems of current leakage and cross color among the plurality of OLEDs can be effectively avoided. In addition, the high PPI of the display panel is effectively ensured, and the display panel presents better pictures.

Figure 7:
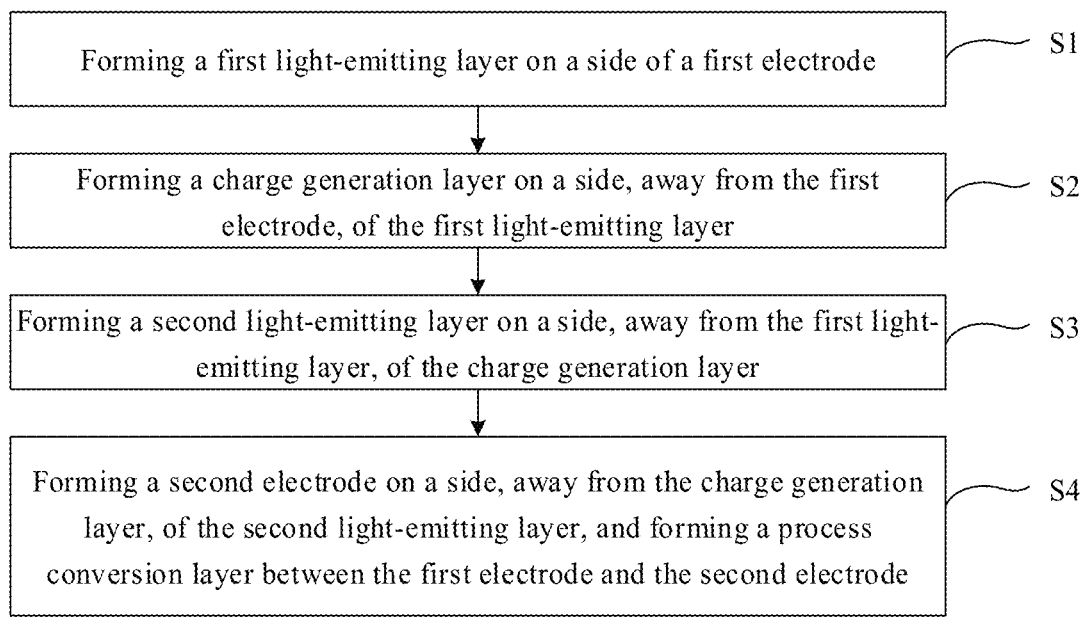
FIG. 7 is a flowchart of a method for manufacturing an OLED according to an embodiment of the present disclosure.

FIG. 7 is a flowchart of a method for manufacturing an OLED according to an embodiment of the present disclosure. The method is applied to manufacture the OLED 100 provided in the foregoing embodiment. Referring to FIG. 7, the method may include the following steps.

In S1, a first light-emitting layer is formed on a side of a first electrode.

In this step, the first light-emitting layer may be processed by an evaporation process. A film may be formed on the first light-emitting layer by the evaporation process, and the evaporation process has advantages, such as simple film formation, high purity and compactness of the film, and unique film structure and performance.

In S2, a charge generation layer is formed on a side, away from the first electrode, of the first light-emitting layer.

In this step, the electrical conductivity of the charge generation layer is relatively high, and therefore the overall performance of the OLED can be significantly improved.

In S3, a second light-emitting layer is formed on a side, away from the first light-emitting layer, of the charge generation layer.

In this step, the second light-emitting layer is provided after the first light-emitting layer is provided, so that the overall luminance of the OLED can be effectively improved, thereby further improving the performance of the OLED.

In S4, a second electrode is formed on a side, away from the charge generation layer, of the second light-emitting layer, and a process conversion layer is formed between the first electrode and the second electrode.

In this step, the process conversion layer 6 is formed by ALD or sputtering deposition. In addition, the process conversion layer is disposed between two organic material layers formed by the evaporation process. The diameter of a single atom is relatively small, and therefore the process conversion layer 6 formed by atomic deposition or sputtering can better fill gaps and uneven positions in the organic material layers, to prevent short circuit in the electrode subsequently formed. In addition, the process conversion layer 6 formed by atomic deposition or sputtering deposition can avoid short circuit under the premise of ensuring a relatively small overall thickness. A plurality of atomic layers are arranged, and then the process conversion layer 6 is formed. As the accuracy of the process conversion layer 6 is high, the process conversion layer 6 can better fill the uneven regions, which can prevent the process conversion layer 6 from being excessively thick, thereby avoiding a significant increase in the overall resistance of the device.

In the OLED 100 manufactured by the manufacturing method provided in the embodiment of the present disclosure, the plurality of light-emitting layers are connected in series, which not only ensures the high luminance and high efficiency of the OLED 100, to ensure the stability of the OLED 100 during working and to avoid the problems of current leakage and cross color among the sub-pixels, but also avoids problems caused by the arrangement of an excessively high PDL. The process conversion layer 6 is formed by depositing aluminum oxide with a thickness ranging from 0.5 nanometers to 1.5 nanometers by ALD. That is, the process conversion layer 6 is a thin layer that is made of metal oxide with relatively poor electrical conductivity and has a relatively small thickness, so that negative impact of electrical conductivity of the process conversion layer 6 on the performance of a device can be ignored.

Referring to FIG. 3, the process conversion layer 6 may be disposed between the first light-emitting layer 2 and the charge generation layer 3. In addition, the first light-emitting layer 2 and the charge generation layer 3 may both be organic material layers manufactured by the evaporation process. That is, the two layers sandwiching the process conversion layer 6 are both organic material layers manufactured by the evaporation process. The process conversion layer 6 is disposed between the two organic material layers formed by the evaporation process, so that the problem of current leakage between the two organic material layers can be effectively avoided.

Alternatively, referring to FIG. 4, the process conversion layer 6 may be disposed between the second light-emitting layer 4 and the second electrode 5. The second light-emitting layer 4 may be an organic material layer manufactured by the evaporation process, and the second electrode 5 may be formed by a thermal evaporation process. The second electrode 5 may be made of a metal material. That is, the two layers sandwiching the process conversion layer 6 are both film layers manufactured by the evaporation process. The second electrode 5 is formed by the thermal evaporation process, so that the stability of the second electrode 5 during working can be ensured, to ensure the normal working of the OLED 100. By forming process conversion layer 6 in advance before the second electrode 5 is formed by the evaporation process, folds or gaps are prevented from occurring in the surface of the side, facing the second electrode 5, of the second light-emitting layer 4, thereby avoiding defects, such as an open circuit, caused by stack of the electrode metal at the folds or gaps.

In the embodiment of the present disclosure, the OLED 100 includes one process conversion layer 6 disposed between the first electrode 1 and the second electrode 5. Therefore, the problems of current leakage and cross color among the plurality of OLEDs 100 of the display panel can be alleviated or even solved, thereby ensuring stable current during the working of the OLED 100. As such, the stability of the device stability is better.

Optionally, referring to FIG. 2, in an existing OLED 100, in a display panel with a structure such as a PDL or an isolation pillar 7, the morphology of an evaporated layer is directly affected by the morphology of the PDL or the isolation pillar 7.

The process conversion layer 6 is formed by ALD or sputtering deposition. Therefore, the process conversion layer 6 can be evenly arranged inside the OLED 100. The thickness of the process conversion layer 6 is relatively small, and the thickness during arrangement may be relatively accurate, which avoids the deformations of layers inside the OLED 100.

In addition, the OLED 100 can be obtained conveniently with the manufacturing method, and the process conversion layer 6 formed by ALD or sputtering deposition can fill the holes and protrusions in the structure between the first light-emitting layer 2 and the second light-emitting layer 4 or uneven paths of current leakage, which are caused by a relatively high PDL, in film layers in the OLED, which can prevent short circuit at the holes or protrusions in the second light-emitting layer 4 subsequently formed.

It needs to be noted that in the OLED 100 manufactured in the embodiment of the present disclosure, except for the process conversion layer 6, other film layers may all be formed by a thermal evaporation (for example, vacuum thermal evaporation) process.

In summary, the present disclosure provides a method for manufacturing an OLED. The OLED manufactured by the method includes a process conversion layer, which not only achieves the separation between devices connected in series with the OLEDs, but also does not affect the morphologies of other layers, under the premise of ensuring that the OLED has relatively high luminance and relatively high efficiency. In addition, the OLED manufactured by this method has a small voltage increase amplitude, and produces a significant effect on a serial device.

As described above, the OLED 100 includes the process conversion layer 6. Therefore, the electrode of the OLED 100 can be prevented from short circuit. When the organic light-emitting display panel is formed, it is not necessary to increase the spacing between a plurality of OLEDs 100 or increase the height of the PDL, which facilitates the manufacture of a high PPI display panel.

Figure 8:
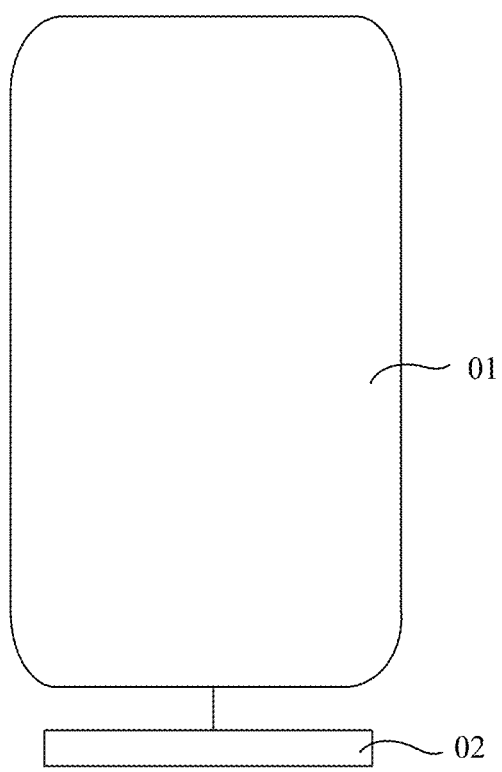
FIG. 8 is a schematic structural diagram of a display device according to the present disclosure.

FIG. 8 is a schematic structural diagram of a display device according to an embodiment of the present disclosure. Referring to FIG. 8, the display device includes the display panel 01 provided in the foregoing embodiments and a power supply component 02. The power supply component 02 may be connected to the display panel 01, and is configured to supply power to the display panel 01.

In the embodiment of the present disclosure, there may be a plurality of processes of manufacturing the process conversion layer 6. For example, the process conversion layer 6 may be manufactured by an atomic layer deposition (ALD) process, or the process conversion layer 6 may be manufactured by a sputtering deposition process. In the embodiments of the present disclosure, it's preferable to manufacture the process conversion layer 6 by an ALD process.

Defects, pin holes, undercuts and the like may be generated in the deposition or film-forming process during manufacture of other film layers of the OLED 100. In addition, even if the material is changed, deposition usually still continues with the original morphology during film formation, as the principle and method of deposition remain the same.

To improve the morphologies, for example, to fill uneven regions, and to fix defects, pin holes, and undercuts in the evaporation process, different processes may be added, so as to make use of the differences in different process deposition principles. For example, in the embodiment of the present disclosure, the ALD process that has a good capability of filling narrow gaps and covering protrusions may be adopted. The advantages of the ALD process lie in relatively thin formed layers and relatively high accuracy. Therefore, during the formation of the process conversion layer 6, the fashion of gradually laminating a plurality of layers may be adopted. Special materials and parameters may be used for implementation, to solve the problems of current leakage, cross color, and color missing of sub-pixels in the device, while the basic photoelectric characteristics (efficiency, luminance, and voltage) of the device are not affected, or even improved.

In addition, it should be noted that the spacer layer or separation pillar described above is represented by the isolation pillar 7 in FIG. 1.

The solutions in the present disclosure are described below with reference to embodiments. Those skilled in the art can understand that the following embodiments are merely intended to describe the present disclosure and should not be construed as limiting the present disclosure. The embodiments in which no specific technologies or conditions are provided are to be implemented according to the technologies or conditions described in the literature in the field or according to the product specifications. The reagents or instruments without manufacturer indicated are all conventional products that may be purchased in the market. All the reagents may be purchased in the market or prepared by the method described in the present disclosure.

Embodiment 1

An OLED 100 is provided with a process conversion layer 6. The process conversion layer 6 is disposed between a charge generation layer 3 and a second light-emitting layer 4, and has a thickness of 5 nanometers. The structure is shown in FIG. 1.

Embodiment 2

An OLED 100 is provided with a process conversion layer 6. The process conversion layer 6 is disposed between a second light-emitting layer 4 and a second electrode 5, and has a thickness of 5 nanometers. The structure is shown in FIG. 4.

Comparison Example

An OLED 100 is not provided with the process conversion layer 6.

Figure 9:
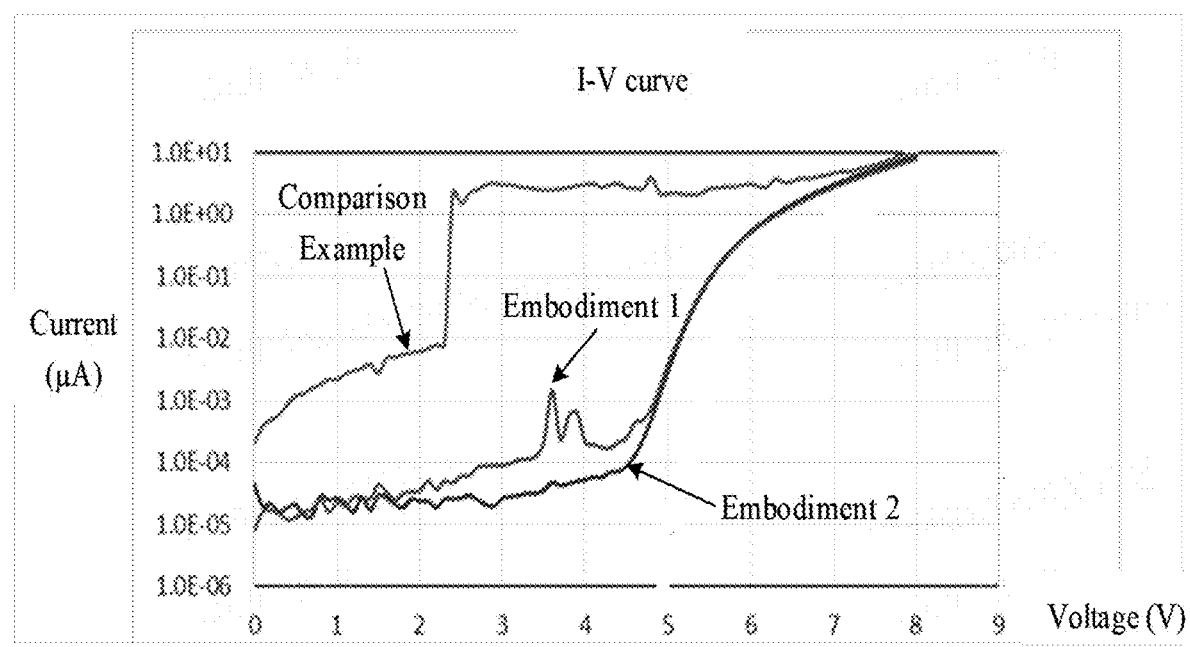
FIG. 9 is an I-V curve after a process conversion layer is provided according to an embodiment of the present disclosure.

Comparison and analysis are performed, and the performance in Embodiment 1, Embodiment 2, and Comparison Example is tested. As can be seen from the I-V curve shown in FIG. 9, during the working of the OLED 100 that is not provided with the process conversion layer 6 in the Comparison Example, the resistance value at the current leakage position of the OLED 100 is relatively small, and the overall current change amplitude is relatively large. Especially, the current at the current leakage position has a relatively large increase amplitude, and it's easy to reach the current leakage voltage before the OLED is lit, to lead to current leakage, while the foregoing deficiencies do not occur in Embodiment 1 and Embodiment 2.

Optionally, a plurality of OLEDs in Embodiment 1 and the Comparison Example are manufactured, and the OLEDs are placed on one substrate for test. The process conversion layer 6 in Embodiment 1 is made of aluminum oxide and has a thickness of 10 angstroms (Å). For Table 1 to Table 3 below, the comparison results between Embodiment 1 and the Comparison Example are analyzed. In Table 1 to Table 3: V represents voltage, with a unit of volt (V); CE represents the current efficiency at a test point, with a unit of candela/ampere (cd/A); J represents current density, with a unit of milliampere/square centimeter (mA/cm$^2$); L represents the luminance of the device, with a unit of candela/square meter (cd/m$^2$); and I represents current, with a unit of microampere (ρA).

Test results of Embodiment 1 and Comparison Example are shown in Table 1 to Table 3 below. Table 1 shows the test data of a single OLED, and Table 2 and Table 3 show the data of tests performed by arranging the plurality of OLEDs in the Comparison Example and Embodiment 1 on one substrate.

TABLE 1

|  | V (V) | CE (cd/A) | J (mA/cm$^2$) | L (cd/m$^2$) |
|---|---|---|---|---|
| Comparison Example | 8.27 | 30.4 | 20 | 6076 |
| Embodiment 1 | 8.25 | 30.6 | 20 | 6111 |

TABLE 2

Reference current in 5 V measurement

| Substrate | Point | I/μA | Average |
|---|---|---|---|
| Comparison Example | 1 | 275 | 185.72 |
|  | 2 | 570 |  |
|  | 3 | 52 |  |
|  | 4 | 110 |  |
|  | 5 | 104 |  |
|  | 6 | 3.3 |  |

TABLE 3

Reference current in 5 V measurement

| Substrate | Point | I/μA | Average |
|---|---|---|---|
| Embodiment 1 | 1 | 12 | 4.8 |
|  | 2 | 3.8 |  |
|  | 3 | 3.4 |  |
|  | 4 | 2.95 |  |
|  | 5 | 3.29 |  |
|  | 6 | 3.47 |  |

For Table 1 to Table 3 above, the comparison results between Embodiment 1 and Comparison Example are analyzed. In Table 1: V represents voltage, CE represents the current efficiency at a test point, J represents current density, and L represents the luminance of the device. As shown in Table 1, it can be seen from the tests that the process conversion layer 6 has no significant negative impact on voltage, current efficiency, and the luminance of the device, and the values of the current efficiency and luminance of the device even slightly increase.

After tests are performed on six points selected in the Comparison Example and Embodiment 1, data in Table 2 and Table 3 is acquired.

As can be seen, measurement is performed at different positions on the entire substrate, and current values when the diode is not fully turned on at a low voltage are shown in the tables. At the reference current in 5V measurement, when the process conversion layer 6 is not provided, that is, in Comparison Example in Table 2, current values at points at various positions on the substrate have relatively big differences, and thus the average current value is relatively big. In the case that the process conversion layer 6 is provided, that is, in Embodiment 1 in Table 3, currents at various points are measured, and the current values at the points are distributed relatively uniformly, the current values converge, and the difference between the average current value and the value at each point is relatively small. Thus, the overall stability of the OLED during working can be improved.

As can be seen, when the process conversion layer 6 is provided, current values at the points can be effectively stabilized, which effectively avoids the problems of current leakage and cross color among the sub-pixels, under the premise of maintaining the high luminance and high efficiency of the OLED 100.

The performance in Embodiment 2 and Comparison Example is tested. Optionally, a plurality of OLEDs in Embodiment 2 and Comparison Example are manufactured, and the OLEDs are placed on one substrate for test. The process conversion layer 6 in Embodiment 2 is made of aluminum oxide and has a thickness of 10 Å. For Table 4 to Table 6 below, the comparison results between Embodiment 2 and the Comparison Example are analyzed. In Table 4 to Table 6, V represents voltage, with a unit of V; CE represents the current efficiency at a test point, with a unit of candela/ampere (cd/A); J represents current density, with a unit of milliampere/square centimeter (mA/cm$^2$); L represents the luminance of the device, with a unit of candela/square meter (cd/m$^2$); and I represents current, with a unit of microampere (μA).

Test results of Embodiment 2 and Comparison Example are shown in Table 4 to Table 6 below. Here, Table 4 shows test data of a single OLED, and Table 5 and Table 6 show data of tests performed by arranging the plurality of OLEDs in the Comparison Example and Embodiment 2 on one substrate.

TABLE 4

|  | V (V) | CE (cd/A) | J (mA/cm$^2$) | L (cd/m$^2$) |
|---|---|---|---|---|
| Comparison Example | 8.27 | 30.4 | 20 | 6076 |
| Embodiment 2 | 8.25 | 30.6 | 20 | 6111 |

TABLE 5

| Reference current in 5 V measurement | | | |
|---|---|---|---|
| Substrate | Point | I/μA | Average |
| Comparison Example | 1 | 275 | 222.2 |
|  | 2 | 570 |  |
|  | 3 | 52 |  |
|  | 4 | 110 |  |
|  | 5 | 104 |  |

TABLE 6

| Reference current in 5 V measurement | | | |
|---|---|---|---|
| Substrate | Point | I/μA | Average |
| Embodiment 2 | 1 | 2.46 | 2.9 |
|  | 2 | 2.95 |  |
|  | 3 | 2.96 |  |
|  | 4 | 3.22 |  |
|  | 5 | 3.11 |  |

For Table 4 to Table 6 above, the comparison results between Embodiment 2 and Comparison Example are analyzed. In Table 4, V represents voltage, CE represents the current efficiency at a test point, J represents current density, and L represents the luminance of the device. As shown in Table 4, it can be seen from the tests that the process conversion layer 6 has no significant negative impact on voltage, current efficiency, and the luminance of the device, and the values of the current efficiency and the luminance of the device slightly increase.

After tests are performed on five points selected in the Comparison Example and Embodiment 2, data in Table 5 and Table 6 is acquired.

As can be seen, measurement is performed at different positions on the entire substrate, and current values when the diode is not fully turned on at a low voltage are shown in the tables. At a reference current in 5V measurement, when the process conversion layer 6 is not provided, that is, in the Comparison Example in Table 5, current values at points at various positions on the substrate have relatively big differences, and thus the average current value is relatively big. In the case that the process conversion layer 6 is provided, that is, in Embodiment 2 in Table 6, currents at the various points are measured. The current values at the points are distributed relatively uniformly, the current value converges, and the difference between the average current value and the value at each point is relatively small. Thus, the overall stability of the OLED during working can be improved.

Therefore, when the process conversion layer 6 is provided, current values at the points can be effectively stabilized, which effectively avoids the problems of current leakage and cross color among the sub-pixels, under the premise of maintaining the high brightness and high efficiency of the OLED 100.

In the descriptions of the present disclosure, orientation or location relationships indicated by terms "up", "down", and the like are based on the orientation or location relationships shown in the accompanying drawings, and are only used for the convenience of describing the present disclosure, rather than limit the present disclosure to constructions and operations in specific orientations. Therefore, the orientation or location relationships cannot be understood as a limitation to the present disclosure.

In the specification, descriptions with reference to terms "an embodiment," "another embodiment," and the like are intended to indicate that the specific features, structures, materials or characteristics described in combination with the embodiments are included in at least one embodiment of the present disclosure. In the specification, the illustrative descriptions of the foregoing terms are not necessarily for the same embodiments or examples. In addition, the specific features, structures, materials or characteristics described may be combined appropriately in any one or more embodiments or examples. Moreover, persons skilled in the art may integrate and combine different embodiments or examples or features in different embodiments or examples in the specification, under the condition of no contradictions. In addition, it should be noted that in the specification, the terms "first" and "second" are merely used for description, but not intended to indicate or imply relative importance or implicitly indicate the quantity of indicated technical features.

Although the embodiments of the present disclosure have been illustrated and described above, it is to be understood that the foregoing embodiments are examples and cannot be construed as a limitation to the present disclosure. Persons of ordinary skill in the art may, within the scope of the present disclosure, make changes, modifications, substitutions, and variations to the foregoing embodiments.

What is claimed is:

1. An organic light-emitting diode (OLED), comprising:
a first electrode;
a first light-emitting layer, disposed on a side of the first electrode;
a charge generation layer, disposed on a side, away from the first electrode, of the first light-emitting layer;
a second light-emitting layer, disposed on a side, away from the first light-emitting layer, of the charge generation layer;
a second electrode, disposed on a side, away from the charge generation layer, of the second light-emitting layer; and
a process conversion layer, formed by one of atomic layer deposition and sputtering deposition, disposed between the first electrode and the second electrode, and configured to fill an uneven region between the first electrode and the second electrode;
wherein each of the first light-emitting layer, the charge generation layer, the second light-emitting layer and the second electrode is formed by a process other than atomic layer deposition and sputtering deposition.

2. The OLED according to claim 1, wherein the process conversion layer is disposed between the charge generation layer and the second light-emitting layer.

3. The OLED according to claim 1, wherein the process conversion layer is disposed between the first light-emitting layer and the charge generation layer.

4. The OLED according to claim 1, wherein the process conversion layer is disposed between the second light-emitting layer and the second electrode.

5. The OLED according to claim 1, wherein a material of the process conversion layer is an insulating material.

6. The OLED according to claim 5, wherein the material of the process conversion layer comprises insulating oxide.

7. The OLED according to claim 6, wherein a thickness of the process conversion layer ranges from 0.2 nm to 5 nm.

8. The OLED according to claim 7, wherein the second electrode is made of a metal material,
wherein the process conversion layer is disposed in one of the following manners: between the charge generation layer and the second light-emitting layer, between the first light-emitting layer and the charge generation layer, and between the second light-emitting layer and the second electrode.

9. The OLED according to claim 1, wherein the second electrode is made of a metal material.

10. A display panel, comprising:
a substrate; and
a plurality of organic light-emitting diodes (OLEDs), disposed on the substrate,
wherein the OLED comprises a first electrode, a first light-emitting layer, a charge generation layer, a second light-emitting layer, a second electrode, and a process conversion layer,
wherein the first light-emitting layer is disposed on a side of the first electrode; the charge generation layer is disposed on a side, away from the first electrode, of the first light-emitting layer; the second light-emitting layer is disposed on a side, away from the first light-emitting layer, of the charge generation layer; and the second electrode is disposed on a side, away from the charge generation layer, of the second light-emitting layer, the process conversion layer is disposed between the first electrode and the second electrode, the process conversion layer is formed by one of atomic layer deposition and sputtering deposition, and the process conversion layer is configured to fill an uneven region between the first electrode and the second electrode; and
each of the first light-emitting layer, the charge generation layer, the second light-emitting layer and the second electrode is formed by a process other than atomic layer deposition and sputtering deposition.

11. The display panel according to claim 10, wherein a pixel defining layer is provided between the plurality of OLEDs.

12. The display panel according to claim 10, wherein a pixel density of the display panel is greater than 1000 PPI.

13. A method for manufacturing an organic light-emitting diode (OLED), comprising:
forming a first light-emitting layer on a side of a first electrode;
forming a charge generation layer on a side, away from the first electrode, of the first light-emitting layer;
forming a second light-emitting layer on a side, away from the first light-emitting layer, of the charge generation layer; and
forming a second electrode on a side, away from the charge generation layer, of the second light-emitting layer,
wherein the method further comprises: forming a process conversion layer by one of atomic layer deposition or sputtering deposition before forming a first layer and after forming a second layer, the first layer and the second layer are two of layers between the first electrode and the second electrode other than the process conversion layer, and the second layer is next to the first layer in a forming sequence of the layers between the first electrode and the second electrode other than the process conversion layer; and
each of the first light-emitting layer, the charge generation layer, the second light-emitting layer and the second electrode is formed by a process other than atomic layer deposition and sputtering deposition.

14. The method according to claim 13, wherein the first light-emitting layer, the charge generation layer, the second light-emitting layer, and the second electrode are all film layers formed by an evaporation process; and
the process conversion layer is disposed between two film layers formed by the evaporation process.

15. The method according to claim 14, wherein the first light-emitting layer, the charge generation layer, and the second light-emitting layer are all organic material layers; and
the process conversion layer is disposed between two of the organic material layers.

16. The method according to claim 14, wherein the process conversion layer is disposed between the second light-emitting layer and the second electrode.

17. The method according to claim 13, wherein a material of the process conversion layer is an insulating material.

18. The method according to claim 17, wherein the material of the process conversion layer comprises insulating oxide.

19. The method according to claim 18, wherein the process conversion layer is formed by depositing aluminum oxide with a thickness ranging from 0.5 nanometers to 1.5 nanometers by atomic layer deposition.

20. The method according to claim 13, wherein the second electrode is made of a metal material.

* * * * *